United States Patent
Yang et al.

(10) Patent No.: US 8,008,669 B2
(45) Date of Patent: Aug. 30, 2011

(54) PROGRAMMABLE ANTI-FUSE STRUCTURE WITH DLC DIELECTRIC LAYER

(75) Inventors: Chih-Chao Yang, Albany, NY (US);
David V. Horak, Albany, NY (US);
Takeshi Nogami, Albany, NY (US);
Shom Ponoth, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 150 days.

(21) Appl. No.: 12/509,892

(22) Filed: Jul. 27, 2009

(65) Prior Publication Data
US 2011/0018093 A1    Jan. 27, 2011

(51) Int. Cl.
*H01L 29/15* (2006.01)

(52) U.S. Cl. ........... 257/77; 257/530; 257/E23.111; 257/E21.005; 257/E21.041; 257/E21.049; 257/E21.27; 438/600

(58) Field of Classification Search .......... 257/77, 257/530, E23.111, E21.005, E21.041, E21.049, 257/E21.27; 438/600
See application file for complete search history.

(56) References Cited

U.S. PATENT DOCUMENTS

| | | | |
|---|---|---|---|
| 5,789,795 | A | 8/1998 | Sanchez et al. |
| 6,124,194 | A | 9/2000 | Shao et al. |
| 6,251,710 | B1 | 6/2001 | Radens et al. |
| 6,335,228 | B1 | 1/2002 | Fuller et al. |

*Primary Examiner* — Tan N Tran
(74) *Attorney, Agent, or Firm* — Scully, Scott, Murphy & Presser, P.C.; Katherine S. Brown, Esq.

(57) ABSTRACT

In one embodiment an anti-fuse structure is provided that includes a first dielectric material having at least a first anti-fuse region and a second anti-fuse region, wherein at least one of the anti-fuse regions includes a conductive region embedded within the first dielectric material. The anti-fuse structure further includes a first diamond like carbon layer having a first conductivity located on at least the first dielectric material in the first anti-fuse region and a second diamond like carbon layer having a second conductivity located on at least the first dielectric material in the second anti-fuse region. In this embodiment, the second conductivity is different from the first conductivity and the first diamond like carbon layer and the second diamond like carbon layer have the same thickness. The anti-fuse structure also includes a second dielectric material located atop the first and second diamond like carbon layers. The second dielectric material includes at least one conductively filled region embedded therein.

13 Claims, 4 Drawing Sheets

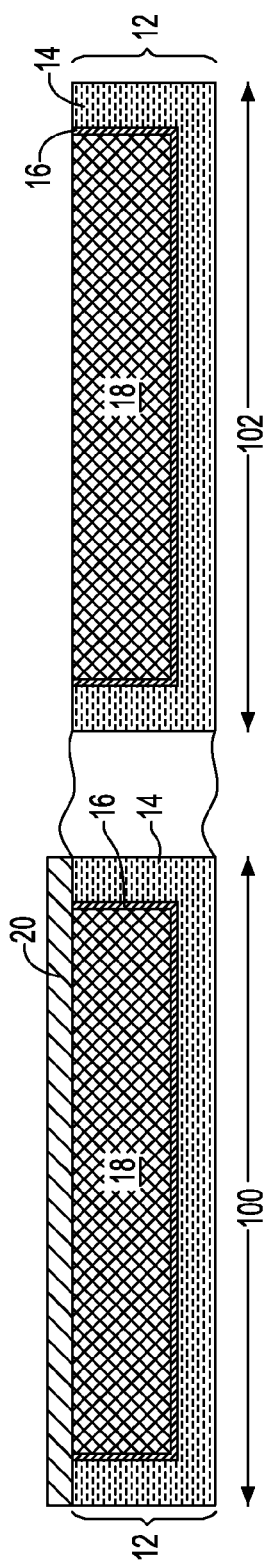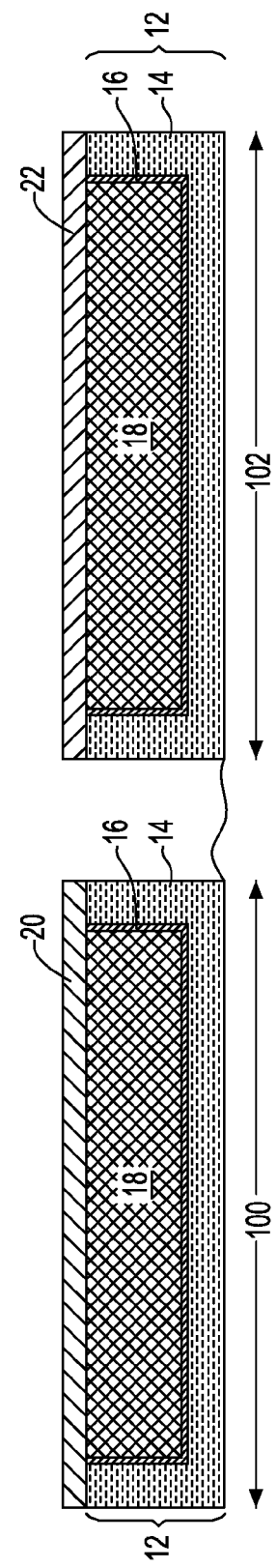

PROGRAMMABLE ANTI-FUSE STRUCTURE WITH DLC DIELECTRIC LAYER

BACKGROUND

The present invention relates to a semiconductor structure and a method of fabricating the same. More particularly, and in one embodiment of the invention, a programmable anti-fuse structure containing a diamond like carbon (DLC) anti-fuse material with different programming efficiency is provided.

The manufacture of integrated circuits (ICs) typically includes the formation of metallization layers which are patterned to provide interconnection between devices. Some IC interconnections are programmable, either with fuses or anti-fuses. Non-programmed fuses provide a low resistance link between or within metallization layers which can be programmed by being blown. That is, the fuse can be caused to be non-conductive by applying a sufficiently high current across it to blow.

Anti-fuses operate in the opposite fashion, i.e., the non-programmed structure used to form the anti-fuse has an intrinsically high resistance, and the programmed structure has a relatively low resistance. By applying a programmable current, the electrical resistance through the anti-fuse material is greatly reduced providing a conductive link between or within metallization levels. Programming of typical anti-fuse structures can be accomplished by providing a voltage of 4-10 volts between the metal layers. Before programming, the anti-fuse structure typically has a resistance of above 1 giga-ohm for a 1 μm diameter via. A programmed anti-fuse forms a conductive path between the metal layers having a resistance of about 20-100 ohms.

Anti-fuse structures allow for much higher programmable interconnection densities than standard fuse structures as well as smaller current and power for the non-programmed elements. Anti-fuse structures have been used in the semiconductor industry for memory related applications, such as, for example, field programmable gate arrays and programmable read-only memories. As indicated above, anti-fuse structures include a material which initially has a high resistance but can be converted into a lower resistance by performing a certain application. For example, an unprogrammed anti-fuse type gate array can be programmed by causing a selected anti-fuse type to become conductive.

With shrinkage of feature dimension, it's required to decrease programming voltage in order to enhance programming efficiency and meet technology compatibility.

Decreasing the dielectric oxide thickness may be a potential approach to meet the requirement of decreasing the programming voltage. However, decreasing the dielectric oxide thickness not only causes uniformity control problems, but also it is a challenge to have a contact sitting and stopping on the thin dielectric oxide film.

SUMMARY

In one aspect of the invention, an anti-fuse structure is provided which includes an anti-fuse dielectric material that has a wide range of conductivity and is tunable without changing the film thickness of the anti-fuse dielectric material.

In one embodiment of the present invention, an anti-fuse structure is provided that includes a first dielectric material having at least a first anti-fuse region and a second anti-fuse region, wherein at least one of the anti-fuse regions includes a conductive region embedded within the first dielectric material. The anti-fuse structure of this embodiment further includes a first diamond like carbon layer having a first conductivity located on at least the first dielectric material in the first anti-fuse region and a second diamond like carbon layer having a second conductivity located on at least the first dielectric material in the second anti-fuse region. In this embodiment of the invention, the second conductivity is different from the first conductivity and the first diamond like carbon layer and the second diamond like carbon layer have the same thickness. The anti-fuse structure also includes a second dielectric material located atop the first and second diamond like carbon layers. The second dielectric material includes at least one conductively filled region embedded therein.

In another embodiment of the invention, an anti-fuse structure is provided that includes a first dielectric material including at least one anti-fuse region, wherein the first dielectric material is devoid of a conductive region embedded therein. The anti-fuse structure of this embodiment further includes a diamond like carbon layer located on the first dielectric material in the at least one anti-fuse region and a second dielectric material located atop the diamond like carbon layer. The second dielectric material of this anti-fuse structure includes at least one conductively filled region embedded therein. In this embodiment, programming occurs by flowing electrons through the diamond like carbon layer.

In another aspect of the invention, a method of forming an anti-fuse structure is provided that includes providing a first dielectric material having at least a first anti-fuse region and a second anti-fuse region, wherein at least one of the anti-fuse regions includes a conductive region embedded within the first dielectric material. A first diamond like carbon layer having a first conductivity is formed on at least the first dielectric material in the first anti-fuse region, a second diamond like carbon layer having a second conductivity is formed on at least the first dielectric material in the second anti-fuse region, and a second dielectric material is formed atop the first and second diamond like carbon layers. In one embodiment, the second conductivity is different from the first conductivity and the first diamond like carbon layer and the second diamond like carbon layer have a same thickness. The second dielectric material that is formed includes at least one conductively filled region embedded therein.

In the above mentioned method, the first and second diamond like carbon layers may be formed by a deposition process in which the first diamond like carbon layer is formed at a first deposition temperature and the second diamond like carbon layer is formed at a second deposition temperature that is different from the first deposition temperature.

In another aspect of the invention, a method of forming an anti-fuse structure is provided that includes forming a first dielectric material having at least one anti-fuse region, wherein the first dielectric material is devoid of a conductive region embedded therein; forming a diamond like carbon layer on the first dielectric material in the at least one anti-fuse region; and forming a second dielectric material atop the diamond like carbon layer, wherein the second dielectric material includes at least one conductively filled region embedded therein.

BRIEF DESCRIPTION OF THE SEVERAL VIEWS OF THE DRAWINGS

FIG. 2 is a pictorial representation (through a cross sectional view) illustrating the structure of FIG. 1A after selectively forming a first diamond like carbon layer having a first conductivity within one of the anti-fuse regions of the initial structure.

FIG. 3 is a pictorial representation (through a cross sectional view) illustrating the structure of FIG. 2 after selectively forming a second diamond like carbon layer having a second conductivity that is different from the first conductivity within the anti-fuse region not including the first diamond like carbon layer.

DETAILED DESCRIPTION

The present invention, which provides an anti-fuse structure including a layer of an anti-fuse dielectric material that has different conductivities with different anti-fuse regions and a method of fabricating the same, will now be described in greater detail by referring to the following discussion and drawings that accompany the present application. It is noted that the drawings are provided for illustrative purposes only and are not drawn to scale.

In the following description, numerous specific details are set forth, such as particular structures, components, materials, dimensions, processing steps and techniques, in order to illustrate the present invention. However, it will be appreciated by one of ordinary skill in the art that various embodiments of the invention may be practiced without these, or with other, specific details. In other instances, well-known structures or processing steps have not been described in detail in order to avoid obscuring the various embodiments of the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1A:
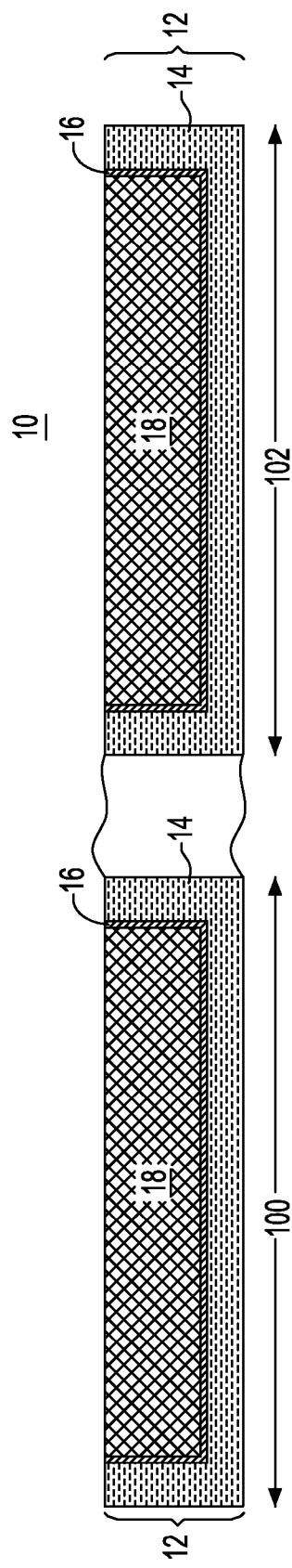
FIG. 1A is a pictorial representation (through a cross sectional view) depicting an initial structure including a lower interconnect dielectric material with a conductive region embedded therein that can be employed in one embodiment of the present invention.

Reference is now made to FIGS. 1A-4A which illustrate basic processing steps that can be employed in one embodiment of the present invention. Specifically, the processing employed includes providing an initial structure 10 such as shown in FIG. 1A which includes a lower interconnect level 12 including a first anti-fuse region 100 and a second anti-fuse region 102. The lower interconnect level 12 comprises a first dielectric material 14 having at least one conductive feature (i.e., a conductive region) 18 that is separated from the first dielectric material 14 by a barrier layer 16. Although two anti-fuse regions are shown and described herein, the initial structure employed many have any number of anti-fuse regions located therein.

Figure 1B:
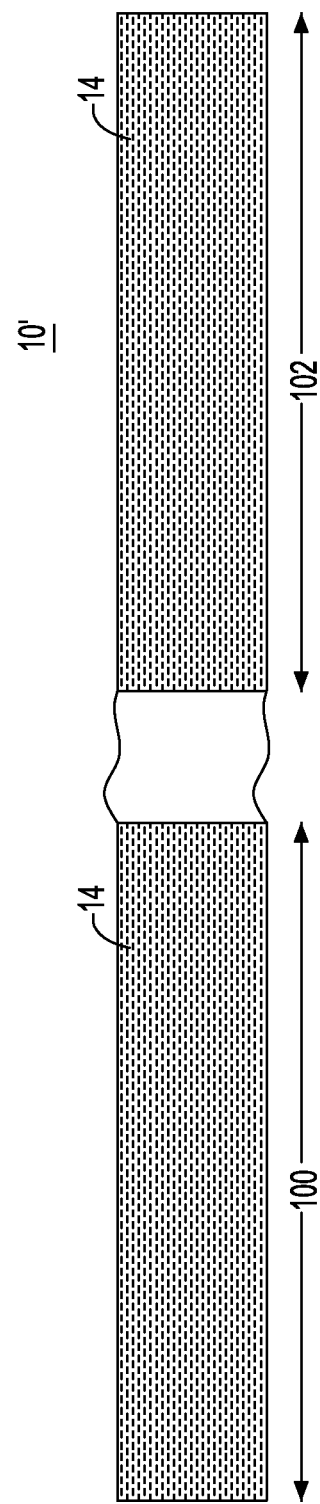
FIG. 1B is a pictorial representation (through a cross sectional view) depicting an initial structure including a lower interconnect dielectric material without a conductive region embedded therein that can be employed in another embodiment of the invention.
Figure 4A:
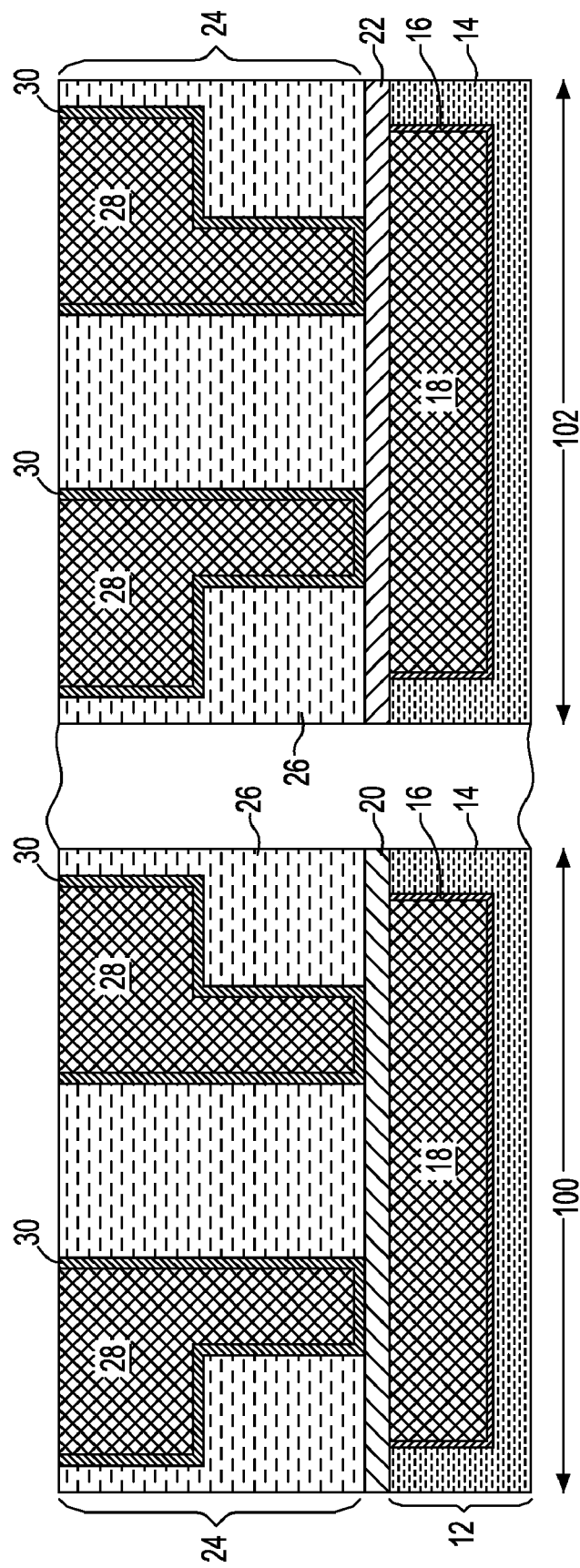
FIG. 4A is a pictorial representation (through a cross sectional view) illustrating an upper interconnect level atop both the first and second diamond like carbon layers of FIG. 3.
Figure 4B:
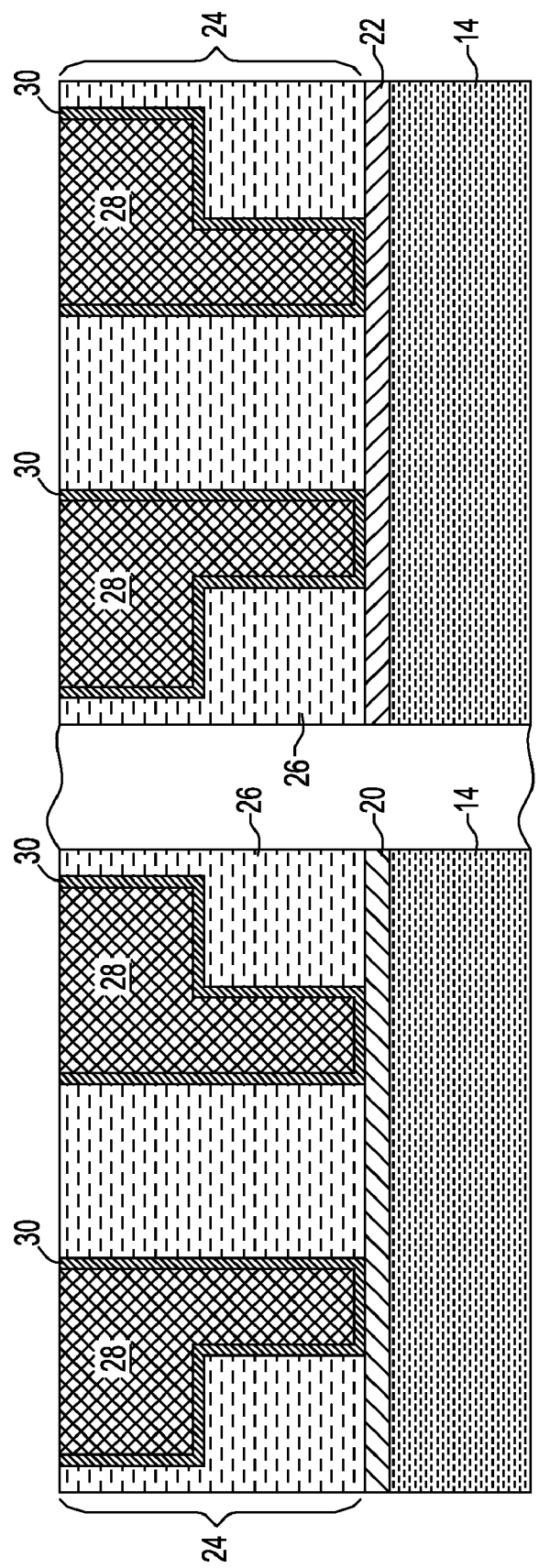
FIG. 4B is a pictorial representation (through a cross sectional view) illustrating an upper interconnect level atop first and second diamond like carbon layers formed when the initial structure is as shown in FIG. 1B.

In another embodiment of the present invention, the initial structure 10' shown in FIG. 1B can be employed and processed to provide the anti-fuse structure shown in FIG. 4B. The initial structure 10' shown in FIG. 1B is identical to the initial structure 10 shown in FIG. 1A except that no conductive region is present within the first dielectric material 14. In yet a further embodiment of the invention, one of the anti-fuse regions may include a conductive region within the first dielectric material 14, while the other anti-fuse region does not include a conductive region within the first dielectric material 14. This latter embodiment of the invention is not particularly shown in the drawings of the present application.

The initial structures 10 and 10' shown in FIG. 1A and FIG. 1B, respectively, can be made utilizing conventional techniques well known to those skilled in the art. For example, the initial structures 10 and 10' can be formed by first applying the first dielectric material 14 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof such as by multilayers. When the substrate is a conducting material, the substrate may include, for example, polySi, an elemental metal, alloys of elemental metals, a metal silicide, a metal nitride or combinations thereof such as by multilayers. When the substrate comprises a semiconducting material, one or more semiconductor devices such as, for example, complementary metal oxide semiconductor (CMOS) devices can be fabricated thereon.

The first dielectric material 14 of the lower interconnect level 12 may comprise any interlevel or intralevel dielectric including inorganic dielectrics or organic dielectrics. The first dielectric material 14 may be porous or non-porous, with porous dielectrics having a dielectric constant of about 2.8 or less being preferred in some embodiments of the present invention. Some examples of suitable dielectrics that can be used as the first dielectric material 14 include, but are not limited to $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 14 typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the first dielectric material 14 may vary depending upon the dielectric material used as well as the exact number of dielectrics within the lower interconnect level 12. Typically, and for normal interconnect structures, the first dielectric material 14 has a thickness from 200 nm to 450 nm.

In embodiments in which the initial structure 10 shown in FIG. 1A is employed, the lower interconnect level 12 also has at least one conductive feature 18 that is embedded in (i.e., located within) the first dielectric material 14. The at least one conductive feature 18 comprises a conductive material that is separated from the first dielectric material 14 by a barrier layer 16. The at least one conductive feature 18 is formed by lithography (i.e., applying a photoresist to the surface of the first dielectric material 14, exposing the photoresist to a desired pattern of radiation, and developing the exposed resist utilizing a conventional resist developer), etching (dry etching or wet etching) an opening in the first dielectric material 14 and filling the etched region with the barrier layer 16 and then with a conductive material forming the conductive region. The barrier layer 16, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the barrier layer 16 may vary depending on the exact means of the deposition process as well as the material employed. Typically, the barrier layer 16 has a thickness from 4 nm to 40 nm, with a thickness from 7 nm to 20 nm being more typical.

Following the barrier layer 16 formation, the remaining region of the opening within the first dielectric material 14 is filled with a conductive material forming the conductive feature 18. The conductive material used in forming the conductive feature 18 includes, for example, polySi, a conductive metal, an alloy comprising at least one conductive metal, a conductive metal silicide or combinations thereof. Preferably, the conductive material that is used in forming the conductive feature 18 is a conductive metal such as Cu, W or Al, with Cu or a Cu alloy (such as AlCu) being highly preferred in the present invention. The conductive material is filled into the remaining opening in the first dielectric material 14 utilizing a conventional deposition process including, but not limited to CVD, PECVD, sputtering, chemical solution deposition or plating. After deposition, a conventional planarization process such as, for example, chemical mechanical polishing (CMP) can be used to provide a structure in which the barrier layer 16 and the conductive feature 18 each have an upper surface that is substantially coplanar with the upper surface of the first dielectric material 14.

After providing the initial structure 10 shown in FIG. 1A, the initial structure 10' shown in FIG. 1B, or an initial structure in which one of the anti-fuse regions includes a conductive material embedded within the first dielectric material and the other anti-fuse region does not include a conductive region embedded within the first dielectric layer 14, a first diamond like carbon layer 20 having a first conductivity is selectively formed atop the lower interconnect level 12 within one of the anti-fuse regions. FIG. 2 illustrates an embodiment of the invention using the initial structure shown in FIG. 1A in which the first diamond like carbon layer 20 is selectively formed atop the lower interconnect level 12 in the first anti-fuse region 100. Although this embodiment is particularly described and illustrated below, the first diamond like carbon layer 20 can also be selectively formed into the second anti-fuse region 102 of the initial structure 10 shown in FIG. 1A. Similarly, the first diamond like carbon layer 20 having a first conductivity can be formed atop any of the anti-fuse regions of the alternative initial structures mentioned above.

Notwithstanding on which anti-fuse region the first diamond like carbon layer 20 is selectively formed, the first diamond like carbon layer 20 is formed on an upper surface of lower interconnect level which includes the first dielectric material 14, and if present, surface portions of the diffusion barrier 16 and the at least one conductive region 18.

The term "diamond like carbon or DLC for short" is used herein to denote amorphous carbon materials that contain significant amounts of $sp^3$ hybridized carbon atoms and display some of the unique properties of natural diamond. In one embodiment of the present invention, tetrahedral amorphous carbon, or ta-C is employed as the first diamond like carbon layer 20. Such ta-C can be considered to be the "pure" form of DLC, since it consists only of $sp^3$ bonded carbon atoms. In another embodiment of the invention, the diamond like carbon that can be used as layer 20 may contain fillers such as hydrogen, or graphitic $sp^2$ carbon. Metallic filler can also be present so long as its content does not change the insulating properties of the diamond like carbon film.

The first diamond like carbon layer 20, which represents a first anti-fuse material of the inventive structure, may be formed by first providing a block mask (not shown) within one of the anti-fuse regions and then the first diamond like carbon layer 20 having the first conductivity may be formed by a conventional deposition process such as chemical vapor deposition (CVD), plasma enhanced chemical vapor deposition (PECVD) or atomic layer deposition (ALD). The conductivity of the first diamond like carbon layer 20 can be predetermined by selecting a particular temperature in which the first diamond like carbon layer 20 is formed.

Specifically, the block mask (which is not shown) employed may include a hard mask, a photoresist or a multi-layered stack thereof. In one embodiment, the block mask is a photoresist. In another embodiment, the block mask is a hard mask selected from a semiconductor oxide, semiconductor nitride, or semiconductor oxynitride.

The block mask may be formed utilizing conventional techniques including a technique that utilizes deposition, photolithography and optionally etching, that are well known to those skilled in the art. In particular, and when the patterned mask is comprised solely of a photoresist, a blanket layer of photoresist material is first applied to the upper surface of the first dielectric material 14 utilizing a conventional deposition process such as, for example, spin-on coating, evaporation, chemical vapor deposition (CVD), and plasma enhanced chemical vapor deposition (PECVD). After deposition of the blanket layer of photoresist, the blanket layer may be patterned by lithography including exposing the photoresist to a desired pattern of radiation and then developing the exposed resist utilizing a conventional resist developer.

When a hard mask is used as the block mask, a blanket layer of hard mask material may be first deposited on the surface of the first dielectric material 14 utilizing a conventional deposition process including, for example, CVD, PECVD, chemical solution deposition, evaporation, atomic layer deposition (ALD), or physical vapor deposition (PVD). A blanket layer of photoresist may be applied atop the blanket layer of hard mask material, and thereafter lithography may be used to pattern the photoresist. The pattern within the patterned resist may be transferred to the underlying hard mask material utilizing one of dry etching (reactive ion etching, ion beam etching, plasma etching, or laser ablation) and chemical wet etching. The patterned resist is optionally removed from the structure following the pattern transfer step utilizing a conventional resist stripping process well known to those skilled in the art. Alternatively, the patterned resist can remain atop the pattern hard mask and form a multilayered patterned mask.

As mentioned above, the first diamond like carbon layer 20 having the first conductivity may be formed by a deposition process such as, for example, CVD, PECVD or ALD. As also mentioned above, the conductivity of the first diamond like carbon layer 20 can be predetermined by selecting a particular temperature in which the first diamond like carbon layer 20 is formed. Typically, the deposition of the first diamond like carbon layer 20 can be performed at a temperature from 20° C. to 600° C., with a temperature within the range of from 100° C. to 200° C. being even more typical. Within the broad temperature range, the first diamond like carbon layer 20 may have a conductivity from $10^{-8}$ ohm$^{-1}$-cm$^{-1}$ to $10^{-12}$ ohm$^{-1}$-cm$^{-1}$.

The first diamond like carbon layer 20 typically has a thickness from 1 nm to 80 nm, with a thickness from 2 nm to 50 nm being even more typical.

After selectively forming the first diamond like carbon layer 20 within one of the anti-fuse regions, a second diamond like carbon layer 22 having a second conductivity that is different from the first conductivity may be selectively formed within the anti-fuse region not including the first diamond like carbon layer 20 which can be illustrated as shown in FIG. 3.

The second diamond like carbon layer 22 may be formed in the same manner as that of the first diamond like carbon layer 20. A different conductivity of the second diamond like carbon layer 22 relative to the conductivity of the first diamond like carbon layer 20 is provided by choosing a different deposition temperature for forming the two diamond like carbon layers.

The thickness of the second diamond like carbon layer 22 may be the same as that of the first diamond like carbon layer 20, while the second conductivity of the second diamond like carbon layer 22 is different from the first conductivity of the first diamond like carbon layer 20. Although the second conductivity is different from the first conductivity, the value of the second conductivity is within the range recited above for the first conductivity.

As such, the structure shown in FIG. 3 may include two diamond like carbon layers having the same thickness, but different conductivities, and hence different programming efficiency, located on the upper surface of the first dielectric material 14. That is, a diamond like carbon film having the same thickness comprising DLC layers 20 and 22 may be formed that has different programming efficiencies within the same level of the structure. It is observed that when no conductive region is present within the first dielectric material 14, programming may occur by flowing electrons through the DLC layer.

As illustrated in FIG. 4A, an upper interconnect level 24 may be formed atop the first diamond like carbon layer 20 and second diamond like carbon layer 22. The upper interconnect level 24 can also be formed atop any of the alternative initial structures mentioned above, after forming the first and second diamond like carbon layers as described above. The upper interconnect level 24 includes a second dielectric material 26 that has at least one conductively filled region 28 representing, for example, a via embedded therein. The at least one conductively filled region 28 may be separated from the second dielectric material 26 and the first and second diamond like carbon layers by a diffusion barrier liner 30.

Specifically, the upper interconnect level 24 may be formed by first applying a second dielectric material 26 to the upper exposed surface of the first diamond like carbon layer 20 and the upper surface of the second diamond like carbon layer 22. The second dielectric material 26 may comprise the same or different, preferably the same, dielectric material as that of the first dielectric material 14 of the lower interconnect level 12. The processing techniques and thickness ranges for the first dielectric material 14 are also applicable here for the second dielectric material 26. The second dielectric material 26 can also comprise two different materials, e.g., deposition of one dielectric material first, followed by deposition of a different dielectric material. In one embodiment of the present invention, the second dielectric material 26 comprises two different low k dielectric materials such that the upper interconnect level 26 has a hybrid structure with a conductively filled region embedded in a porous dielectric material, and a conductively filled region embedded in a dense (i.e., non porous) dielectric material. In such an embodiment, the porous low k dielectric may have a dielectric constant of about 2.8 or less, and the dense porous low k dielectric may have a dielectric constant of about 4.0 or less.

At least one opening may be formed into the second dielectric material 26 by first forming a blanket hard mask material (not shown) atop the upper surface of the second dielectric material 26. The at least one opening may include a via opening, a line opening or a combined via and line opening. The at least one opening may be formed by a single damascene process or a dual damascene process. Damascene processes typically include at least two iterations of photolithography and etching.

A diffusion barrier liner 30 may be then formed into the at least one opening. The diffusion barrier liner 30 comprises any other material that can serve as a barrier to prevent a conductive material from diffusing there through. Illustratively, the diffusion barrier of the conductively filled region which may represent a combined trench and via includes a layer or material stack of TaN, Ta, Ti, TiN, RuTa, RuTaN, W, Ru, Co, Rh or Ir or any combination thereof.

The diffusion barrier liner 30 may be formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the diffusion barrier liner 30 may vary depending on the number of material layers within the barrier, the technique used in forming the same, as well as the material of the diffusion barrier itself. Typically, the diffusion barrier liner 30 has a thickness from 4 nm to 40 nm, with a thickness from 7 nm to 20 nm being even more typical.

In some embodiments of the present invention, a plating seed layer (not shown) may be formed atop the diffusion barrier liner 30. When employed, the plating seed layer may be comprised of a metal or metal alloy from Group VIIIA of the Periodic Table of Elements. Examples of suitable materials for the plating seed layer include, but are not limited to Ru, TaRu, Ir, Rh, Pt, Pd and alloys thereof. In some embodiments, it is preferred to use Ru, Ir or Rh as the plating seed layer.

The plating seed layer may be formed by a conventional deposition process including, for example, chemical vapor deposition (CVD), plasma enhanced chemical vapor deposition (PECVD), atomic layer deposition (ALD), plating, sputtering or physical vapor deposition (PVP). The thickness of the plating seed layer may vary depending on number of factors including, for example, the compositional material of the plating seed layer and the technique that was used in forming the same. Typically, the plating seed layer has a thickness from 0.5 nm to 10 nm, with a thickness of less than 6 nm being even more typical.

The at least one opening in this structure, with or without the plating seed layer, may be filled with an interconnect conductive material and planarized to provide the planarized structure shown in FIG. 4A or 4B including at least one conductively filled region 28. The interconnect conductive material employed in forming the at least one conductively filled region 28 may comprise the same or different, preferably the same, conductive material as that of the at least one conductive feature 18 (if present). Preferably, Cu, Al, W or alloys thereof are used, with Cu or AlCu being most preferred. The interconnect conductive material employed in forming the at least one conductively filled region 28 may be formed utilizing the same deposition processing as described above in forming the at least one conductive feature 18. Following deposition of the conductive material, the structure may be subjected to planarization.

It is noted that the anti-fuse structures provided herein include an anti-fuse material, i.e., DLC layers 20 and 22, that has a wide range of conductivity which is tunable without having a different thickness therein. Although these anti-fuse elements may contain the same material and have the same physical thickness, their electrical property may be dramatically different. For example, the electrical conductivity difference between these elements may be 2 to 4 orders. This wide range of conductivity difference within an anti-fuse structure makes the circuit design and related applications much more flexible.

While the present invention has been particularly shown and described with respect to various embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An anti-fuse structure comprising:
a first dielectric material including at least a first anti-fuse region and a second anti-fuse region, wherein at least one of the anti-fuse regions includes a conductive region embedded within the first dielectric material;
a first diamond like carbon layer having a first conductivity located on at least the first dielectric material in the first anti-fuse region and a second diamond like carbon layer having a second conductivity located on at least the first dielectric material in the second anti-fuse region, wherein said second conductivity is different from the first conductivity and said first diamond like carbon layer and the second diamond like carbon layer have a same thickness; and
a second dielectric material located atop the first and second diamond like carbon layers, wherein said second dielectric material includes at least one conductively filled region embedded therein.

2. The anti-fuse structure of claim 1 wherein said first and second dielectric materials are the same or different dielectric materials and are selected from SiO$_2$, a silsesquioxane, a C doped oxide that include atoms of Si, C, O and H, a thermosetting polyarylene ether, or a multilayer thereof.

3. The anti-fuse structure of claim 1 wherein said conductive region in the first dielectric material includes one of Cu, Al and W.

4. The anti-fuse structure of claim 1 wherein the at least one conductively filled region within the second dielectric material includes one of Cu, Al and W.

5. The anti-fuse structure of claim 1 wherein said first and second diamond like carbon layers are the same or different and are selected from tetrahedral amorphous carbon, diamond like carbon that further contains hydrogen and diamond like carbon that further includes graphitic sp$^2$ carbon.

6. The anti-fuse structure of claim 5 wherein both said first and second diamond like carbon layers are comprised of tetrahedral amorphous carbon.

7. The anti-fuse structure of claim 1 wherein a conductive region is located within the first dielectric material in both the first and second anti-fuse regions.

8. The anti-fuse structure of claim 1 wherein said first and second conductivities are within a range from $10^{-8}$ ohm$^{-1}$-cm$^{-1}$ to $10^{-12}$ ohm$^{-1}$-cm$^{-1}$.

9. A method of forming an anti-fuse structure comprising:
providing a first dielectric material including at least a first anti-fuse region and a second anti-fuse region, wherein at least one of the anti-fuse regions includes a conductive region embedded within the first dielectric material;
forming a first diamond like carbon layer having a first conductivity on at least the first dielectric material in the first anti-fuse region;
forming a second diamond like carbon layer having a second conductivity on at least the first dielectric material in the second anti-fuse region, wherein said second conductivity is different from the first conductivity and said first diamond like carbon layer and the second diamond like carbon layer have a same thickness; and
forming a second dielectric material atop the first and second diamond like carbon layers, wherein said second dielectric material includes at least one conductively filled region embedded therein.

10. The method of claim 9 wherein said first and second diamond like carbon layers are formed by a deposition process in which the first diamond like carbon layer is formed at a first deposition temperature and the second diamond like carbon layer is formed at a second deposition temperature that is different from the first deposition temperature.

11. The method of claim 10 wherein said deposition process is selected from chemical vapor deposition, plasma enhanced chemical vapor deposition and atomic layer deposition.

12. The method of claim 10 wherein said first and second deposition temperatures are within a range from 20° C. to 600° C.

13. The method of claim 9 wherein the first and second diamond like carbon layers are the same or different and are selected from tetrahedral amorphous carbon, diamond like carbon that further contains hydrogen and diamond like carbon that further includes graphitic sp$^2$ carbon.

* * * * *